United States Patent [19]

Kamon

[11] Patent Number: 5,382,999
[45] Date of Patent: Jan. 17, 1995

[54] OPTICAL PATTERN PROJECTING APPARATUS

[75] Inventor: Kazuya Kamon, Itami, Japan

[73] Assignee: Mitsubishi Denki Kabushiki Kaisha, Tokyo, Japan

[21] Appl. No.: 164,959

[22] Filed: Dec. 10, 1993

[30] Foreign Application Priority Data

Dec. 11, 1992 [JP] Japan .................. 4-331902

[51] Int. Cl.6 ............................................ G03B 27/00
[52] U.S. Cl. ........................................ 355/53; 355/67
[58] Field of Search ................................ 355/53, 67

[56] References Cited

U.S. PATENT DOCUMENTS

| 4,851,882 | 7/1989 | Takahashi et al. | 355/67 X |
| 4,851,978 | 7/1989 | Ichihara | 355/67 X |
| 5,300,972 | 4/1994 | Kamon | |
| 5,311,249 | 5/1994 | Kamon et al. | 355/53 X |

Primary Examiner—Michael L. Gellner
Assistant Examiner—Daniel P. Malley
Attorney, Agent, or Firm—Leydig, Voit & Mayer

[57] ABSTRACT

An optical pattern projecting apparatus comprising a divergent mirror 16 for converting a light beam 13 from a light source 11 into a radially outwardly divergent light beam 13b and a convergent mirror 18 for converting the divergent light beam 13b into a radially inwardly convergent light beam 13d. The convergent light beam 13d is converted by a parallelizing mirror 17 into a parallel zonal ringed light beam 13e which is focused onto a surface of the work piece 15. A polarization beam splitter may be used for deflection-angular polarizing and splitting the light beam into an S-polarized light and a P-polarized light.

11 Claims, 13 Drawing Sheets

OPTICAL PATTERN PROJECTING APPARATUS

BACKGROUND OF THE INVENTION

This invention relates to an optical pattern projecting apparatus and, more particularly, to an optical pattern projecting apparatus for use in manufacture of an optical disk semiconductor device or a mask such as a photo mask for LSIs.

Figure 14:
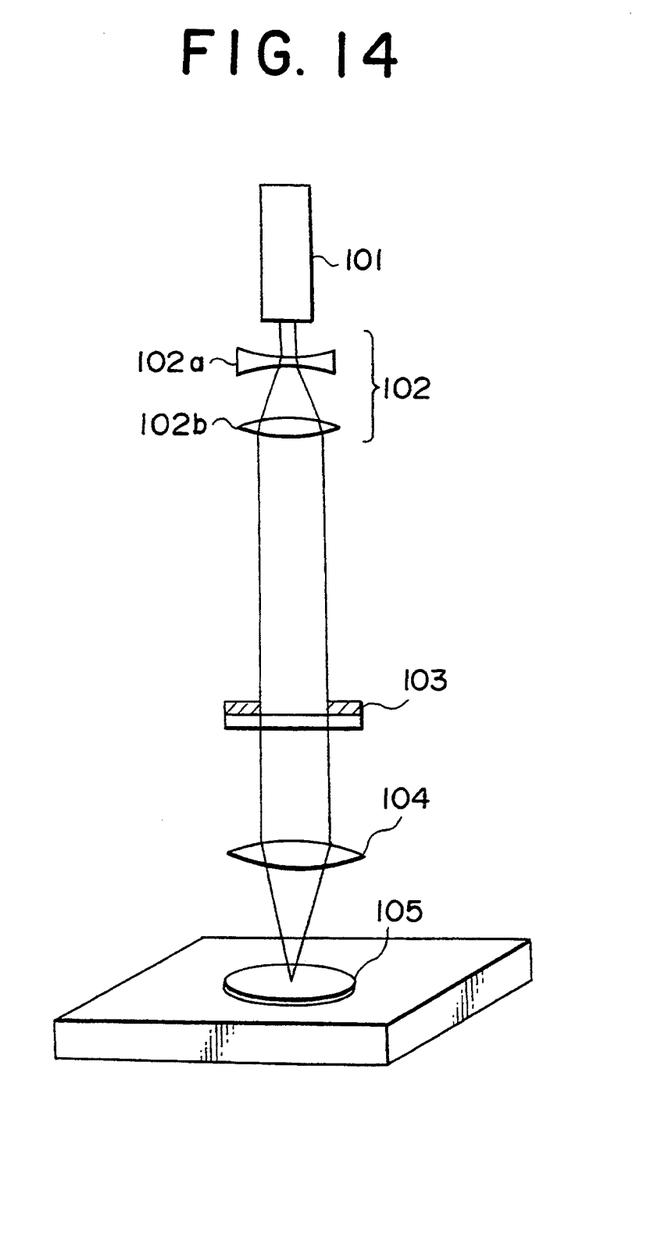
FIG. 14 is a diagram showing an optical system of a known optical pattern projecting apparatus.

FIG. 14 illustrates an optical system of a known optical pattern projecting apparatus. In the known optical pattern projecting apparatus, as illustrated in FIG. 14, a laser oscillator 101 such as a KrF excimer laser is disposed therein. On the axis of a laser beam emitted from the laser oscillator 101, a relay lens 102, a beam generator member 103 and a condenser lens 104 are disposed in turn so that each is perpendicular to the axis of the laser beam. As seen from FIG. 14, the relay lens 102 comprises a concave lens 102a and a convex lens 102b disposed under the concave lens 102a.

In the known optical pattern projecting apparatus as described above, the laser beam emitted from the laser oscillator 101 is diverged by the concave lens 102a of the relay lens 102 and converted by the convex lens 102b into a parallel beam along the axis of the laser beam. The laser beam passes through the beam generator member 103 which is disposed under the relay lens 102, and the laser beam is condensed and focused by the condenser lens 104 onto a surface of a Si wafer 105 to project a circuit pattern thereon.

Figure 15:
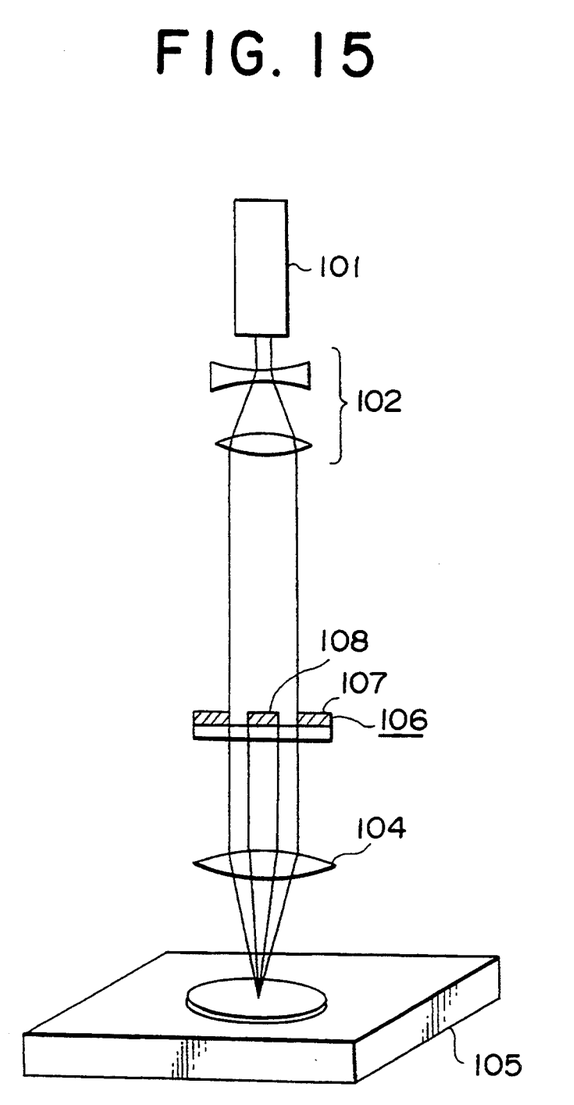
FIG. 15 is a diagram showing an optical system of a known optical pattern projecting apparatus having a zonal ringed diaphragm.

FIG. 15 illustrates an optical system of another known optical pattern projecting apparatus which is useful in projecting a more minute circuit pattern on the wafer 105. A fine circuit pattern is useful in increasing the capacity of the semiconductor device. In FIG. 15, a zonal ringed diaphragm 106 is used in place of the beam generator member 103 illustrated in FIG. 14 for shielding low NA (numerical aperture) components of the parallel light beam, which have comparatively low NAs, and generating a zonal ringed beam for illumination, whereby the resolution becomes comparatively good. The zonal ringed diaphragm 106 comprises an annular diaphragm 107 and a disk-shaped diaphragm 108 having a small outer diameter and concentrically disposed in the ringed diaphragm 107.

In the known optical pattern projecting apparatus as described above, since the low NA components are shielded by the zonal ringed diaphragm 106, the resolution becomes good, but the power of the beam has been undesirably lost.

SUMMARY OF THE INVENTION

Accordingly, one object of the present invention is to provide an optical pattern projecting apparatus free from the above-discussed problems of the known optical pattern projection apparatus.

Another object of the present invention is to provide an optical pattern projection apparatus in which the power of the beam is not lost while providing a good resolution.

With the above object in view, the optical pattern projecting apparatus of the present invention comprises a light source for emitting a light beam for projecting a pattern on a work piece, a divergent mirror for reflecting and converting the light beam emitted from the light source into a divergent light beam diverging with a radially outward component relative to the axis of the light beam, a convergent mirror for reflecting and converting the divergent light beam into a convergent light beam converging with a radially inward component relative to the axis of the light beam, a parallelizing mirror for reflecting and converting the convergent light beam into a parallel zonal ringed light beam along the axis of the light beam and a condenser lens for condensing and forcusing the parallel light beam onto a surface of the work piece.

Further, in place of the divergent mirror, a divergent polarization beam splitter may be used for deflection-angular polarizing and splitting the light beam emitted from the light source into an S-polarized light component and a P-polarized light component and reflecting and converting the S-polarized light component into a divergent light beam diverging with a radially outward component relative to the axis of the light beam.

Alternatively, in place of the parallelizing mirror, a parallelizing polarization beam splitter may be used for deflection-angular polarizing and splitting the convergent light beam into an S-polarized light component and P-polarized light component and reflecting and converting the S-polarized light component into a parallel zonal ringed beam along the axis of the light beam.

The divergent polarization beam splitter and the parallelizing polarization beam splitter may comprise a first conical lens having a total reflection surface and a second conical lens having a surface complementarily combined with the total reflection surface of the first cone lens and having an index of refraction different from the index of refraction of the first conical lens.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
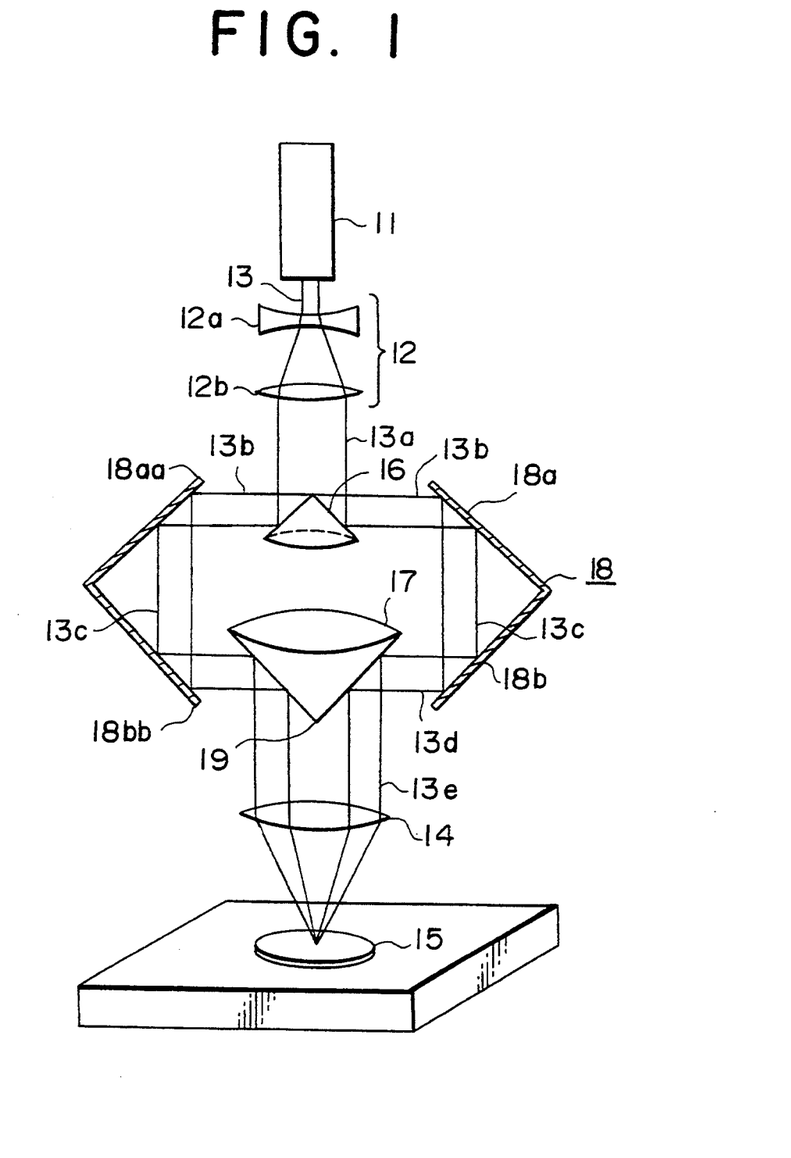
FIG. 1 is a schematic diagram showing an optical system of an embodiment of the optical pattern projecting apparatus of the present invention.

FIG. 1 illustrates an optical system of an embodiment of an optical pattern projecting apparatus of the present invention. As illustrated in FIG. 1, the optical pattern projecting apparatus of the present invention comprises a light source such as a KrF excimer laser oscillator for emitting a light beam 13 for projecting a pattern on a work piece, a relay lens 12 composed of a concave lens 12a and a convex lens 12b, first and second cone-shaped mirrors 16 and 17 as first and second zonal ringed mirrors and a condenser lens 14, these being disposed in line along the axis of the light beam 13 emitted from the light source 11. The optical pattern projecting apparatus of the present invention further comprises a relay mirror 18 disposed as a convergent mirror around the first and second cone-shaped mirrors 16 and 17. The relay mirror 18 is composed of a pair of the frusto-conical mirrors 18a and 18b. Each of the frusto-conical mirrors 18a and 18b is a comparatively short hollow frusto-conical member expanding from one end 18aa or 18bb toward the other end so that the diameter of the one end 18aa or 18bb is smaller than that of the other end, and these ends being completely open. The frusto-conical mirrors 18a and 18b are attached to each other at each other's larger ends and coaxially disposed with respect to the axis of the light beam 13 so that the smaller end 18aa of the frusto-conical mirror 18a is above the smaller end 18bb of the frusto-conical mirror 18b.

In the optical pattern projecting apparatus of the present invention as described, the light beam 13 emitted from the light source 11 is converted by the relay lens 12 into a parallel light beam 13a which has a diameter larger than that of the light beam 13 and impinges upon the first cone-shaped mirror 16. The parallel light beam 13a is reflected and converted into a divergent light beam 13b, which diverges with a radially outward component relative to the axis of the light beam 13, by the first cone-shaped mirror 16 as a divergent mirror and directed to one of the frusto-conical mirrors 18a of the relay mirror 18. The divergent light beam 13b is reflected by the frusto-conical mirror 18a and converted into a zonal ringed light beam 13c parallel to the axis of the light beam 13. The zonal ringed light beam 13c impinges upon the second frusto-conical mirror 18b and is reflected and converted into a convergent light beam 13d converging onto the second cone-shaped mirror 17 with a radially inward component. The convergent light beam 13d is converted into a parallel zonal ringed light beam 13e with respect to the axis of the light beam 13 by the second cone-shaped mirror 17 as a parallelizing mirror. The condenser lens 14 condenses and focuses the parallel zonal ringed light beam 13e onto a surface of the substrate 15 such as an Si wafer for projecting a circuit pattern thereon. Since the axial position of the second cone-shaped mirror 17 is adjusted so that the top 19 of the cone is not illuminated by the light beam 13d, the light beam 13e reflected from the second cone-shaped mirror 17 becomes the parallel zonal ringed light beam 13e.

According to the optical pattern projecting apparatus of the present invention, as described above, the low NA (numerical aperture) components, which have a comparatively small incident angle to the substrate 15, are eliminated from the parallel light beam 13e. Since the zonal ringed illuminating uses only the high NA components, a high resolution can be obtained. Further, the energy of the light beam is not lost as the light beam is not shielded or intercepted by for example a diaphragm at all.

Figure 2:
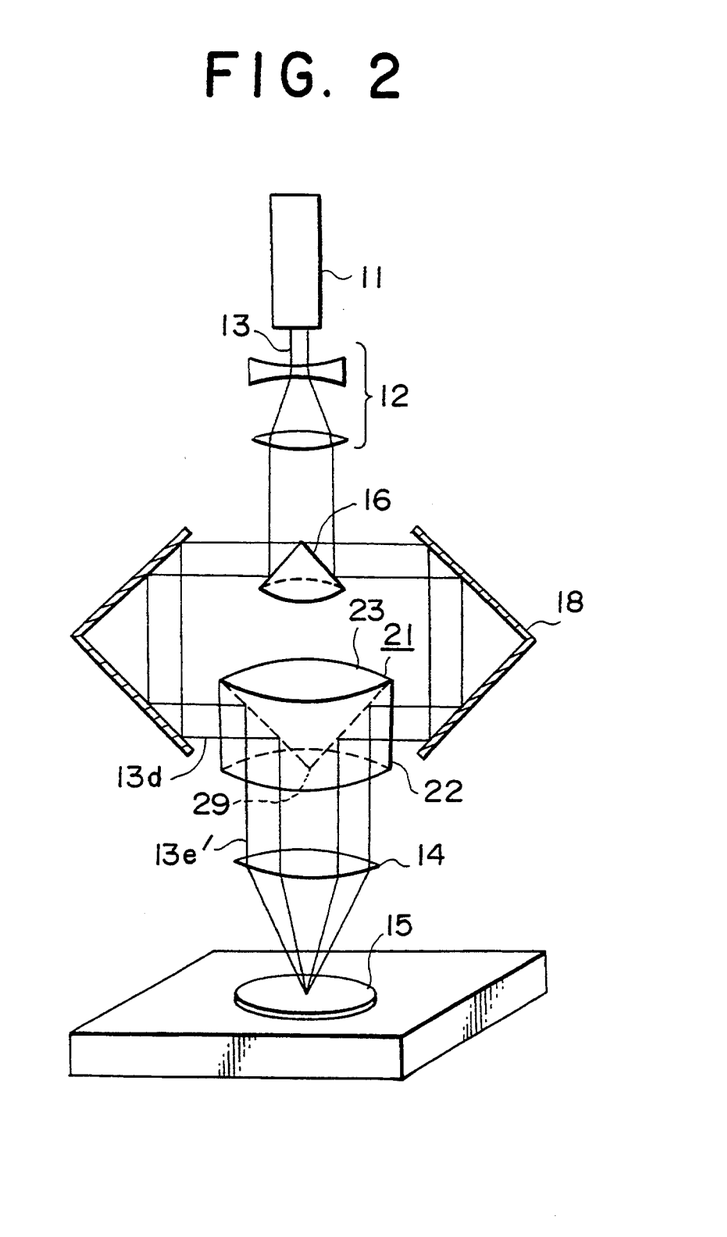
FIG. 2 is a schematic diagram showing an optical system of another embodiment of the optical pattern projecting apparatus of the present invention.
Figure 3:
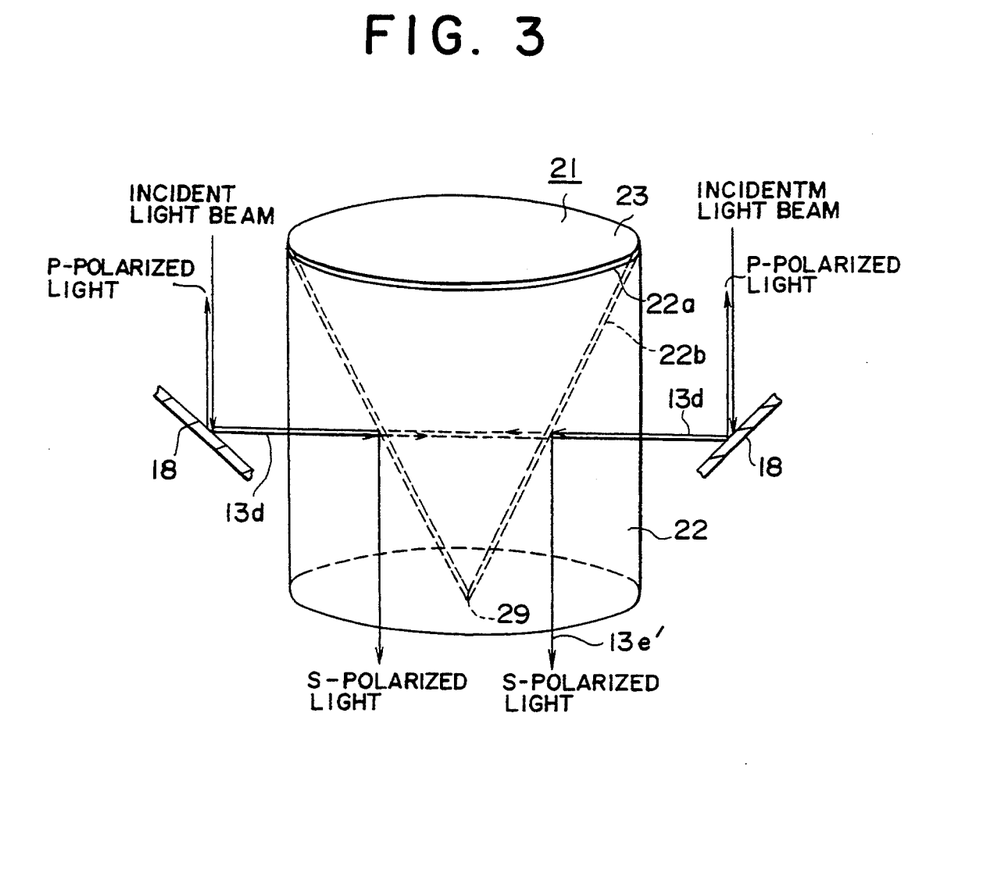
FIG. 3 is an enlarged perspective view of the polarization beam splitter illustrated in FIG. 2.

FIG. 2 illustrates another embodiment of the optical pattern projecting apparatus of the present invention, which has basically the same structure as that illustrated in FIG. 1 but is different in that a parallelizing polarization beam splitter 21 is used for projecting a circuit pattern on the work piece with the zonal ringed illumination and the polarized illumination at the same time in place of the second cone-shaped mirror 17 of the above embodiment illustrated in FIG. 1. FIG. 3 is an enlarged perspective view of the parallelizing polarization beam splitter 21. As illustrated in FIG. 3, the beam splitter 21 is composed of a first conical lens 22 having a concave total reflection surface and a second conical lens 23 having a convex surface complementarily combined with the total reflection surface of the first conical lens 22. The first conical lens 22 is a cylindrical member having an open conical concave portion 22b which is inverted therein and has the same center and diameter as the center and the diameter of the cylindrical outward form thereof. The second conical lens 23 has an index of refraction different from the index of refraction of the first conical lens 22. The second conical lens 23 is a convex member complementarily combined with the conical concave portion 22b of the first conical lens 22.

In this embodiment of the optical pattern projecting apparatus of the present invention, as illustrated in FIG. 2, the light beam 13 emitted from the light source 11 is converted and directed to the parallelizing polarization beam splitter 21 perpendicular to the axis of the beam splitter 21 through the same route as that of the embodiment illustrated in FIG. 1. The incident light beam 13d is deflection-angular polarized and split into an S-polarized light component and a P-polarized light component by the beam splitter 21 as illustrated in FIG. 3. The S-polarized light component is reflected downwardly at the reflection surface of the first conical lens 23 and condensed and focused by the condenser lens 14 onto the surface of the substrate 15 such as an Si wafer for projecting an electronic circuit pattern. On the other hand, as illustrated in FIG. 3, the P-polarized light component passes through the beam splitter 21 and is reflected by the opposite portion of the relay mirror 18 and returns toward the light source 11 with the reverse route. Therefore, the P-polarized light component does not contribute to the projection of the pattern. As the S-polarized light has a resolution higher than that of the P-polarized light, the resolution can be higher by using the S-polarized light for the projection of the pattern. The superiority of the S-polarized light will be described later.

Also in the embodiment, similarly to the second cone-shaped mirror 17 in FIG. 1 of the above embodiment, as the position of the parallelizing polarization beam splitter 21 is adjusted so that the top 29 of the second conical lens 23 of the parallelizing polarization beam splitter 21 is not illuminated by the light beam, the light beam reflected from the parallelizing polarization beam splitter 21, which is composed of the S-polarized light component, becomes the parallel zonal ringed light beam 13e' along the axis of the light beam 13 emitted from the light source 11, including only the high NA components.

Figure 7:
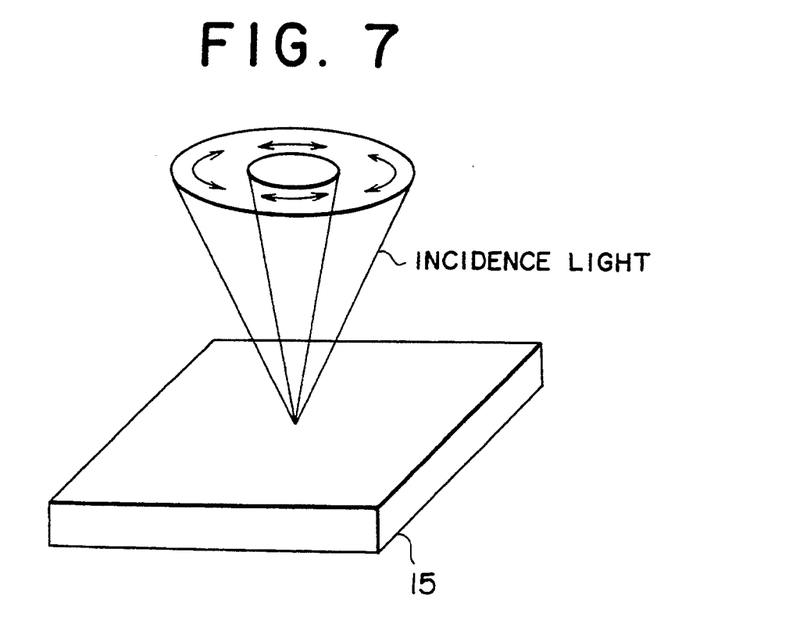
FIG. 7 is a diagram showing how the light beam is polarized and condensed onto a surface of a work piece in the embodiment illustrated in FIG. 2.

In the embodiment of the optical pattern projecting apparatus of the present invention, as described above, as the parallelizing polarization beam splitter 21 is employed for the "deflection-angular" polarizing, in which the light beam is concentric-circularly polarized, the zonal ringed illumination and the polarized illumination by the S-polarized light can be carried out at the same time for projecting a pattern. FIG. 7 illustrates how the light beam is concentric-circularly polarized and condensed and focused by the condenser lens 14 onto the surface of the substrate 15. Therefore, a high resolution can be realized without loss of the power in the light beam.

Figure 4:
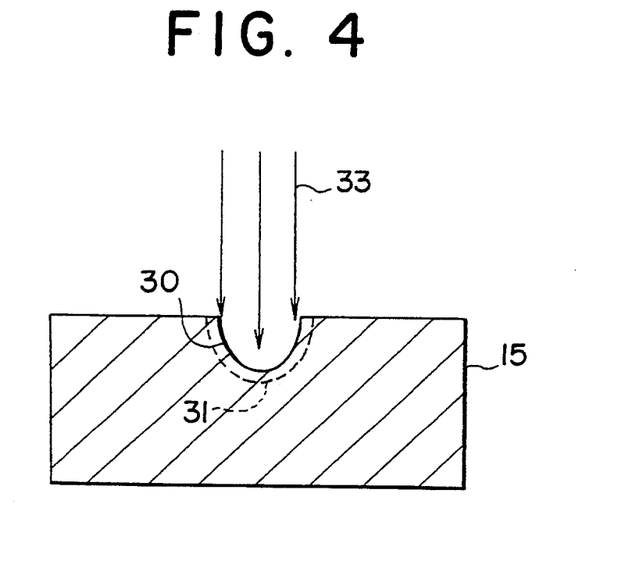
FIG. 4 is a sectional diagram showing resolving power of P-polarized light.
Figure 5:
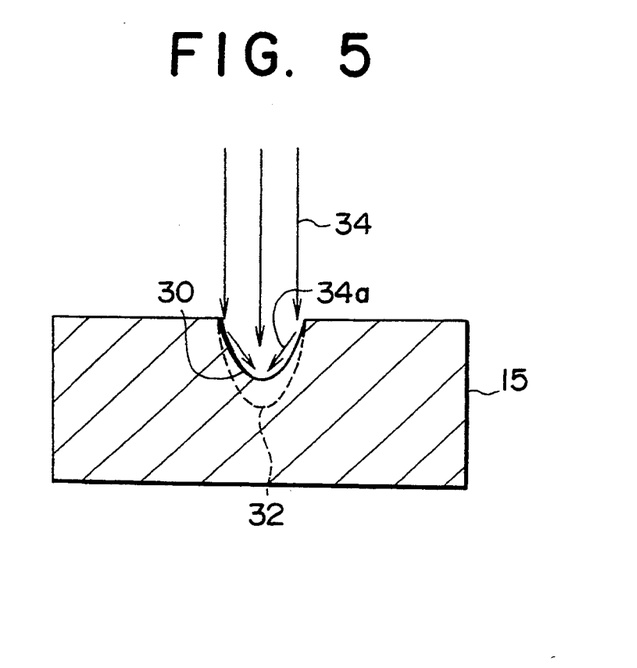
FIG. 5 is a sectional diagram showing resolving power of S-polarized light.

FIGS. 4 and 5 illustrate the state during the patterning process, respectively by the P-polarized light and the S-polarized light. Now, as illustrated in FIGS. 4 and 5, a notched portion shown by the solid lines 30 has been formed in the surface of the substrate 15 respectively by the P-polarized light and the S-polarized light. As seen from FIG. 4, when the P-polarized light 33 enters the notched portion 30, the light 33 acts on the notched portion 30 not only in the progress direction but also in the perpendicular direction and the notched portion 30 is cut out to the dotted line 31 since the P-polarized light has a low reflectance from the incidence plane and is significantly absorbed. On the other hand, since the S-polarized light 34 has a high reflectance from the incidence plane and is not significantly absorbed, when the S-polarized light 34 enters the notched portion 30 as illustrated in FIG. 5, the reflectance components 34a are raised as shown by arrows in FIG. 5, the energy of the light 34 can reach comparatively deep, and the notched portion 30 is cut to the dotted line 32 as illustrated in FIG. 5. As described above, the S-polarized light is suitable for improving the resolution in the case of ablation using the chemical excitation and the exoergic caused by the laser beam is used for projecting a pattern, as compared with the P-polarized light.

Figure 6:
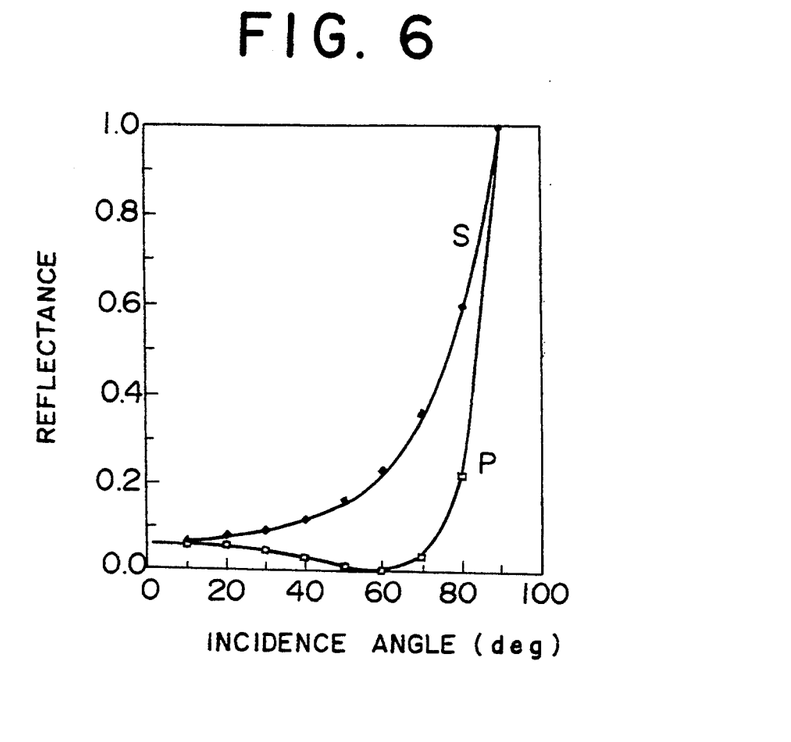
FIG. 6 is a graph showing the relation between the incident angle and the reflectances of P-polarized and S-polarized light beams.

FIG. 6 illustrates the relation between the incidence angle and the reflectances of the P-polarized light and S-polarized light. The reflectance $R_1$ of the P-polarized light and the reflectance $R_2$ of the S-polarized light when the incidence angle $\theta_i$ and the transmission angle $\theta_t$ are given by the following equations:

$$R_1 = \{\tan^2(\theta_i - \theta_t)\}/\{\tan^2(\theta_i + \theta_t)\}$$

$$R_2 = \{\sin^2(\theta_i - \theta_t)\}/\{\sin^2(\theta_i + \theta_t)\}$$

As seen from FIG. 6, the S-polarized light has a reflectance $R_2$ substantially twice as high as that of the P-polarized light, on an average.

Figure 8:
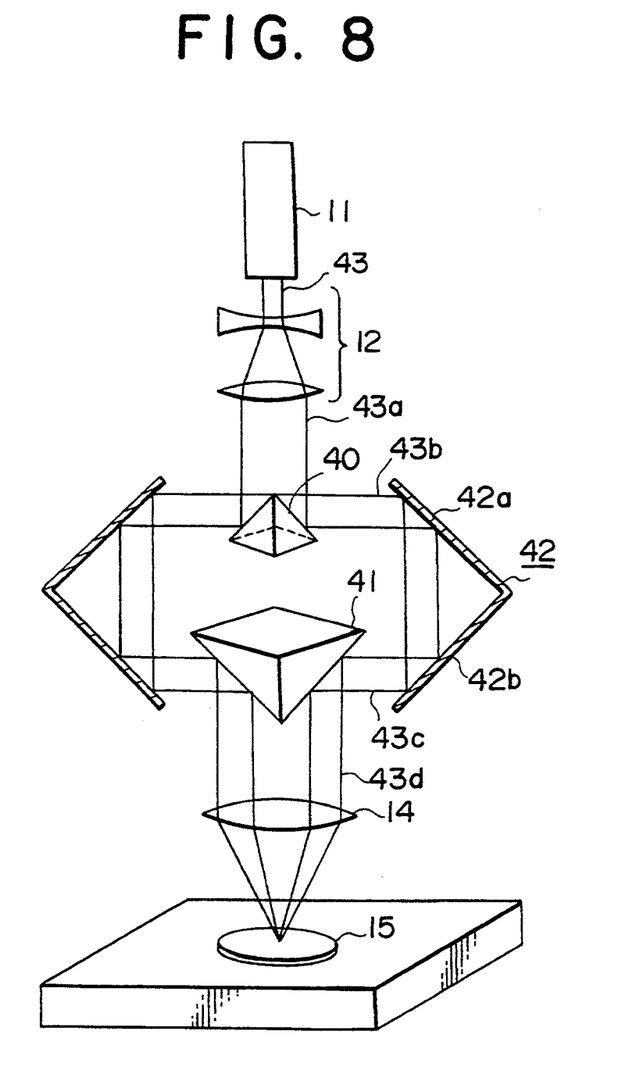
FIG. 8 is a schematic diagram showing an optical system of still another embodiment of the optical pattern projecting apparatus.

FIG. 8 illustrates still another embodiment of the optical pattern projecting apparatus of the present invention. In the embodiment, as illustrated in FIG. 8, first and second pyramidal mirrors 40 and 41 are employed in place of the first and second conical shaped mirrors 16 and 17 illustrated in FIG. 1. The first and second pyramidal mirrors 40 and 41 are respectively composed of four triangular plane mirrors combined with one another at one anothers' sides. Alternatively, the first and second pyramidal mirrors 40 and 41 may be composed of a pyramidal base glass having a surface on which an evaporated aluminum layer, for example, is deposited. In accordance with the first and second pyramidal mirrors 40 and 41, a square relay mirror 42 is used. The square relay mirror 42 is composed of hollow, frame-shaped square frusto-conical mirrors 42a and 42b which have structures similar to that of the frusto-conical mirrors 18a and 18b of the relay mirror 18 illustrated in FIG. 1 except that the relay mirror 42 is square in transverse cross section while the relay mirror 18 is circular. Namely, each of the square cylindrical mirrors 42a and 42b is a comparatively short hollow square-frusto-conical member expanding from one open end toward the other open end so that the width of the one open end is smaller than that of the other open end. Each of the square cylindrical mirrors 42a and 42b is composed of four trapezoidal mirror plates combined with one another at one anothers' oblique sides. The square cylindrical mirrors 42a and 42b are attached to each other at each other's larger open ends and disposed so that each of the sides of the larger open ends is parallel to the sides of the square bottoms of the first and second pyramidal mirrors 40 and 41. Also, in this embodiment, similarly to the above embodiment illustrated in FIG. 1, the position of the second pyramidal mirror 41 is axially adjusted so that the top of the conical is not illuminated by the light beam.

The light beam 43 emitted from the light source 11 is converted by the relay lens 12 into a parallel light beam 43a which has a diameter larger than that of the light beam 13 and directed to the first pyramidal mirror 40. The parallel light beam 43a is reflected at the four triangular surfaces of the first pyramidal mirror 40 and divided into four parallel light beams extending in a plane perpendicular to the axis of the beam 43a and separated from each other by 90°. In this sense, these four separate beams may be considered as a divergent light beam 43b which diverges with a radially outward component relative to the axis of the light beam 43. The divergent light beam 43b is converted by the relay mirror 42 into a convergent light beam 43c converging from four directions onto the second square conical shaped mirror 41 with a radially inward component. The convergent light beam 43c is reflected at the four triangular surfaces of the second pyramidal mirror 41 and converted into a parallel light beam 43d. Since the light beam 43d reflected from the surfaces of the second pyramidal mirror 41 composed of four separate beams parallel to each other and the top of the pyramidal mirror 41 is not illuminated, the light beam 43d reflected from the second pyramidal mirror 41 becomes a circumferentially discontinuous parallel zonal ringed light beam 43d. This embodiment is suitable for projecting a square pattern on the substrate 15. Further, similarly to the embodiment illustrated in FIG. 1, the low NA components are eliminated in the parallel light beam 43d and the zonal ringed illumination using only the high NA components is achieved resulting in a high resolution. While the square pyramidal mirrors 40 and 41 are employed in this embodiment, other polygonal pyramidal mirrors may equally be employed.

Figure 9:
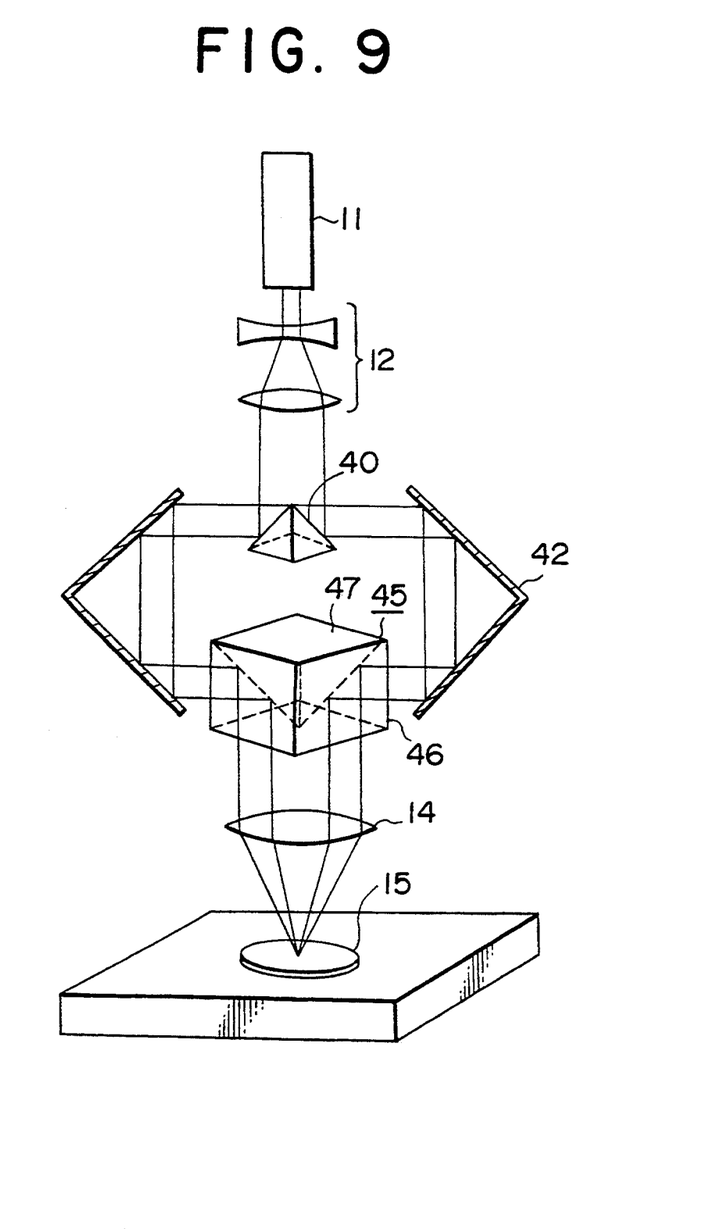
FIG. 9 is a schematic diagram showing an optical system of a further embodiment of the optical pattern projecting apparatus.

FIG. 9 illustrates still another embodiment of the optical pattern projecting apparatus of the present invention in which a substantially cube shaped polarization beam splitter 45 is employed in place of the second pyramidal mirror 41 of the embodiment illustrated in FIG. 8. The other structures are the same as that illustrated in FIG. 8 and the description of them is omitted. The polarization beam splitter 45 is composed of a first concave-shaped conical lens 46 having a total reflection surface and a second convex-shaped conical lens 47 having a surface complementarily combined with the total reflection surface of the first conical lens 46, similarly to the polarization beam splitter 21 of the embodiment illustrated in FIGS. 2 and 3. The first conical lens 46 is a square cylindrical shaped or substantially cube shaped member having an open conical concave portion which is inverted therein and has a common open top with the first conical lens 46. The second convex shaped conical lens 47 is a convex member complementarily combined with the conical concave portion of the first conical lens 46. Also, since the axial position of the polarization beam splitter 45 is adjusted similarly to the above embodiment illustrated in FIG. 2, the zonal ringed illuminating and the deflection-angular polarization illumination using S-polarized light are achieved at the same time and therefore a high resolution can be attained. This embodiment is also suitable for projecting a square pattern on the substrate 15. The pyramidal mirrors 40 and the cube shaped polarization beam splitter 45 are employed in this embodiment, however, a polygonal conical shaped mirror and polygonal cylindrically shaped polarization beam splitter may equally be employed.

Figure 10:
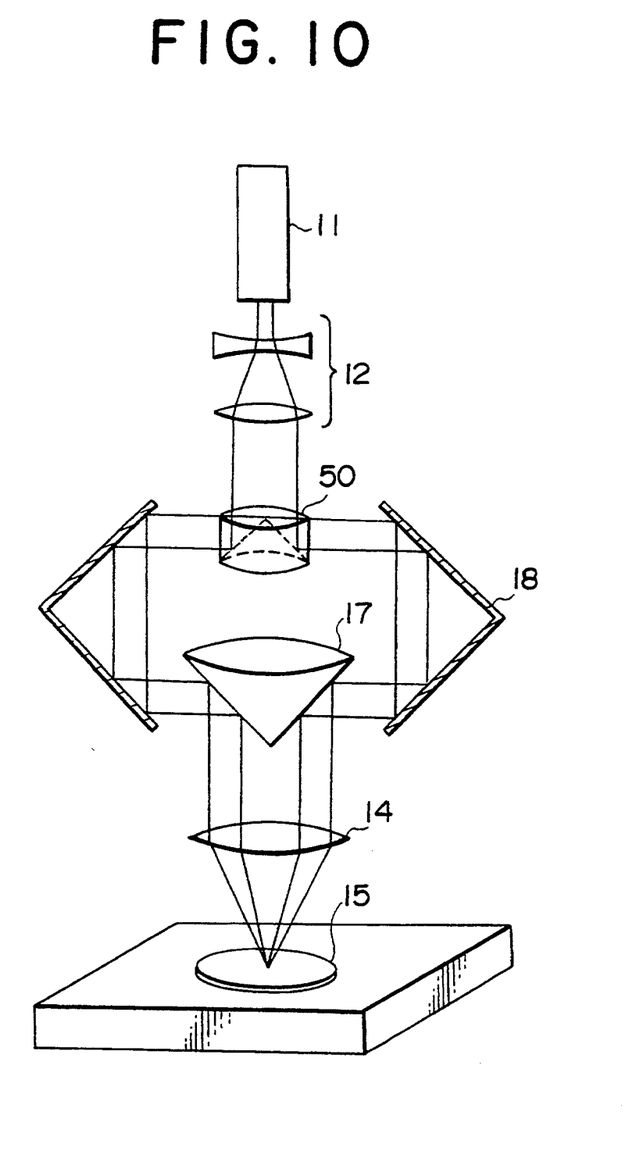
FIG. 10 is a schematic diagram showing an optical system of a still further embodiment of the optical pattern projecting apparatus.

FIG. 10 illustrates another embodiment of the optical pattern projecting apparatus of the present invention, which also has basically the same structure as that illustrated in FIG. 1 but is different in that in this arrangement a cylindrical polarization beam splitter 50 is used in place of the first conical shaped mirror 16 in FIG. 1. The other structures are the same as that illustrated in FIG. 1 and a description of them is omitted.

Figure 11:
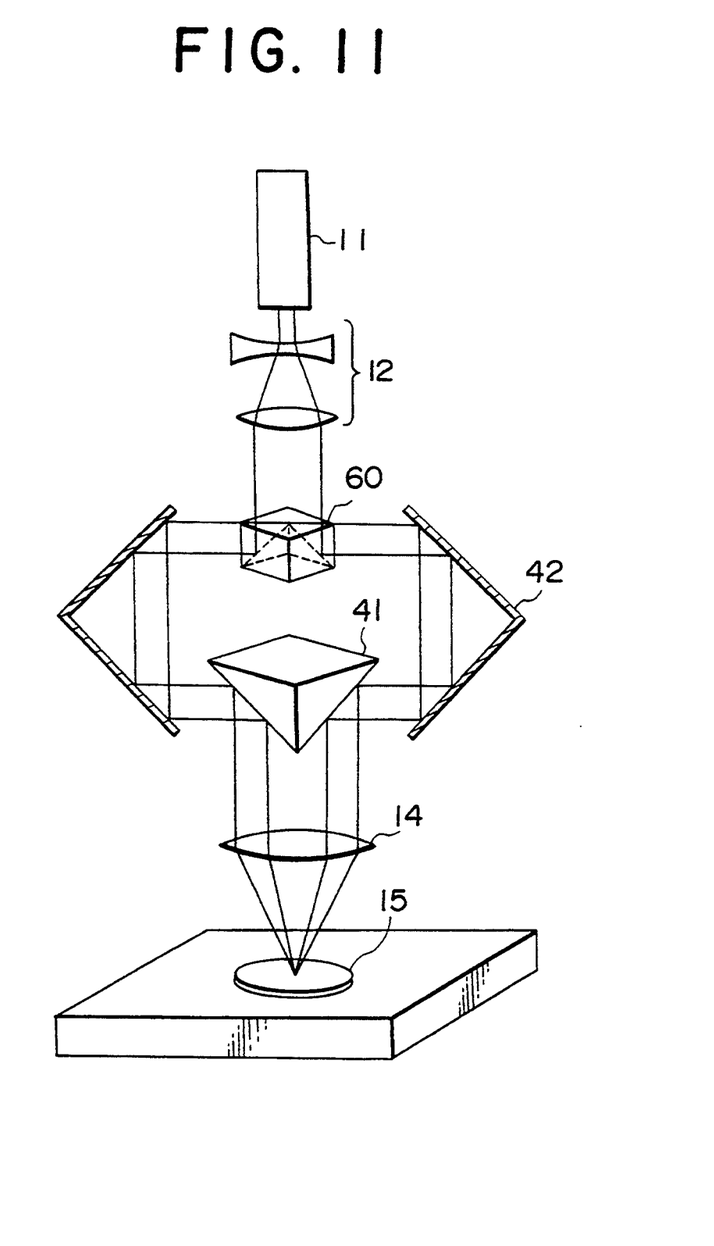
FIG. 11 is a schematic diagram showing an optical system of still another embodiment of the optical pattern projecting apparatus.

FIG. 11 illustrated still another embodiment of the optical pattern projecting apparatus of the present invention, which has the basically same structure as that illustrated in FIG. 8 but is different in that, in FIG. 11, a substantially cube shaped polarization beam splitter 60 is used in place of the first pyramidal mirror 40.

In the embodiments illustrated in FIGS. 10 and 11, the deflection-angular polarization illumination by S-polarized light using the cylindrical polarization beam splitter 50 or the cube shaped polarization beam splitter 60 is achieved at the same time as when the zonal ringed illumination is carried out since the position of the second conical shaped mirror 17 in FIG. 10 or the second pyramidal mirror 41 is adjusted so that the top thereof is not illuminated by the light beam and the light beam reflected therefrom becomes the zonal ringed light beam. Hence, also in these embodiments, similarly to the above embodiments, a high resolution can be attained.

Figure 12:
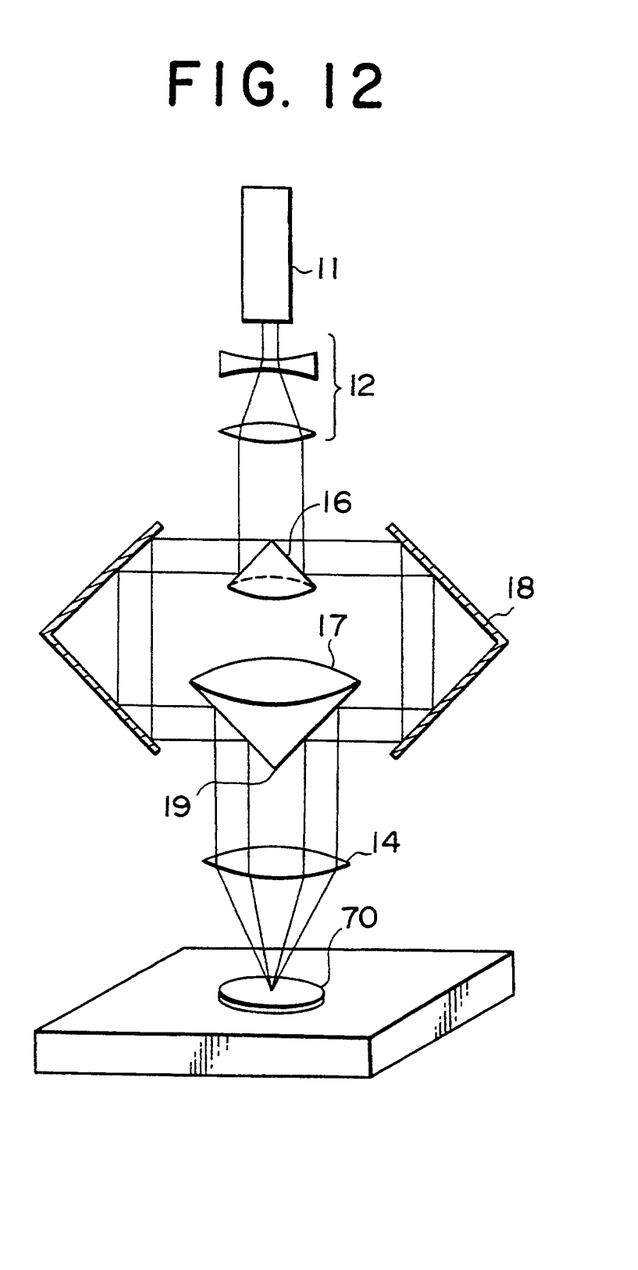
FIG. 12 is a diagram showing the application of the optical pattern projecting apparatus of the present invention to manufacturing of an optical disc.
Figure 13:
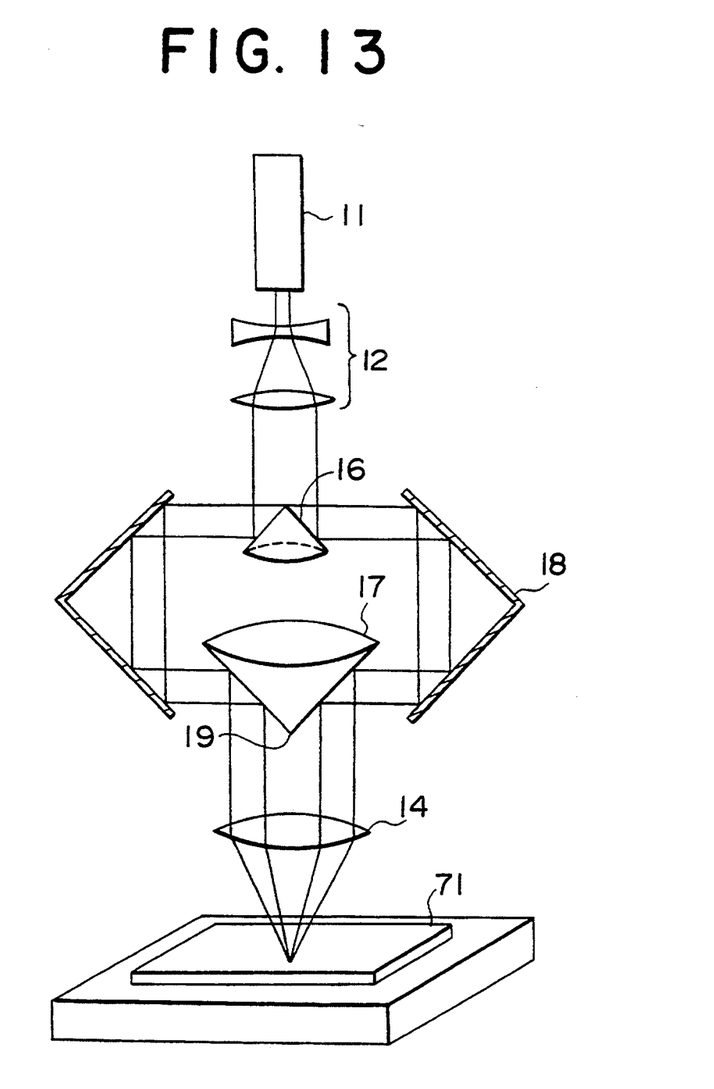
FIG. 13 is a diagram showing the application of the optical pattern projecting apparatus of the present invention to manufacturing of a mask.

The above embodiments may be used for projecting a pattern on an optical disc 70 or a mask 71 as illustrated in FIGS. 12 and 13.

As has been described, according to the optical pattern projecting apparatus of the present invention, since the zonal ringed illuminating by the high NA components can be carried out while the power of the light beam is maintained, a high resolution can be attained. Further, by using the polarization beam splitter, the deflection-angular polarization illumination by S-polarized light can be achieved at the same time that the zonal ringed illuminating is achieved. Therefore, the optical pattern projecting apparatus of the present invention can afford further improved resolution.

What is claimed is:

1. An optical pattern projecting apparatus comprising:
    a light source for emitting a light beam along an axis for projecting a pattern onto a work piece;
    a divergent mirror for reflecting and converting the light beam emitted from said light source into a divergent light beam diverging with a radially outward component relative to the axis of the light beam;
    a convergent mirror for reflecting and converting the divergent light beam into a convergent light beam converging with a radially inward component relative to the axis of the light beam;
    a parallelizing mirror for reflecting and converting the convergent light beam into a parallel zonal ringed light beam along the axis of the light beam; and
    a condenser lens for condensing and focusing the parallel zonal ringed light beam onto a surface of the work piece.

2. The optical pattern projection apparatus as claimed in claim 1 wherein the divergent mirror and parallelizing mirrors have conical surfaces.

3. The optical pattern projection apparatus as claimed in claim 1 wherein the divergent mirror and parallelizing mirrors have pyramidal surfaces.

4. An optical pattern projecting apparatus comprising:
    a light source for emitting a light beam along an axis for projecting a pattern onto a work piece;
    a divergent polarization beam splitter for polarizing and splitting the light beam emitted from said light source into an S-polarized light component and a P-polarized light component and reflecting and converting the S-polarized light component into a divergent light beam diverging with a radially outward component relative to the axis of the light beam;
    a convergent mirror for reflecting and converting the divergent light beam into a convergent light beam converging with a radially inward component relative to the axis of the light beam;
    a parallelizing mirror for reflecting and converting the convergent light beam into a parallel zonal ringed light beam along the axis of the light beam; and
    a condenser lens for condensing and focusing the parallel zonal ringed light beam onto a surface of the work piece.

5. The optical pattern projecting apparatus as claimed in claim 4 wherein said divergent polarization beam splitter comprises;
    a first conical lens having a total reflection surface and an index of refraction; and
    a second conical lens having a surface complementary to said total reflection surface of said first conical lens and having an index of refraction different from the index of refraction of said first conical lens.

6. The optical pattern projection apparatus as claimed in claim 4 wherein the parallelizing mirror has a conical surface.

7. The optical pattern projection apparatus as claimed in claim 4 wherein the parallizing mirror has a pyramidal surface.

8. An optical pattern projecting apparatus comprising:
- a light source for emitting a light beam along an axis for projecting a pattern onto a work piece;
- a divergent mirror for reflecting and converting the light beam emitted from said light source into a divergent light beam diverging with a radially outward component relative to the axis of the light beam;
- a convergent mirror for reflecting and converting the divergent light beam into a convergent light beam converging with a radially inward component relative to the axis of the light beam;
- a parallelizing polarization beam splitter for polarizing and splitting the convergent light beam into an S-polarized light component and a P-polarized light component and reflecting and converting the S-polarized light component into a parallel zonal ringed light beam along the axis of the light beam; and
- a condenser lens for condensing and focusing the parallel zonal ringed light beam onto a surface of the work piece.

9. The optical pattern projecting apparatus as claimed in claim 8 wherein said divergent polarization beam splitter comprises:
- a first conical lens having a total reflection surface and an index of refraction; and
- a second conical lens having a surface complementary to said total reflection surface of said first conical lens and having an index of refraction different from the index of refraction of said first conical lens.

10. The optical pattern projection apparatus as claimed in claim 8 wherein the divergent mirror has a conical surface.

11. The optical pattern projection apparatus as claimed in claim 8 wherein the divergent mirror has a pyramidal surface.

* * * * *